United States Patent
Ishiguro

(10) Patent No.: US 6,847,577 B2
(45) Date of Patent: Jan. 25, 2005

(54) SEMICONDUCTOR MEMORY WITH INTER-BLOCK BIT WIRES AND INTER-BLOCK GROUND WIRES

(75) Inventor: Mitsuhiro Ishiguro, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/706,597

(22) Filed: Nov. 12, 2003

(65) Prior Publication Data

US 2004/0159870 A1 Aug. 19, 2004

(30) Foreign Application Priority Data

Nov. 11, 2002 (JP) ........................................ 2002-327239

(51) Int. Cl.[7] .............................................. G11C 17/12
(52) U.S. Cl. .................. 365/230.03; 365/104; 365/204; 365/185.16; 257/390
(58) Field of Search ...................... 365/185.16, 230.03, 365/104, 103, 203, 204; 257/390

(56) References Cited

U.S. PATENT DOCUMENTS 5,392,233 A * 2/1995 Iwase ......................... 365/104
5,671,173 A * 9/1997 Tomita ......................... 365/63

FOREIGN PATENT DOCUMENTS

JP 5-167042 7/1993 ......... H01L/27/112

* cited by examiner

Primary Examiner—Andrew Q. Tran
(74) Attorney, Agent, or Firm—Scully, Scott, Murphy & Presser

(57) ABSTRACT

A memory cell array is composed of a plurality of blocks separated in column direction every three word lines. Inter-block bit wires are arranged. Each inter-block bit line connects a middle diffusion wire for one of the memory cell units of first block of the separated blocks and the middle diffusion wire for one of the memory cell units of the adjacent second block lying on the other end side of the diffusion wires of the first block. Inter-block ground wires are arranged. Each inter-block ground wire connects the boundary diffusion wire for the one memory cell unit of the first block and the boundary diffusion wire for the one memory cell unit of the adjacent third block lying on the one end side of the diffusion wires of the first block.

9 Claims, 10 Drawing Sheets

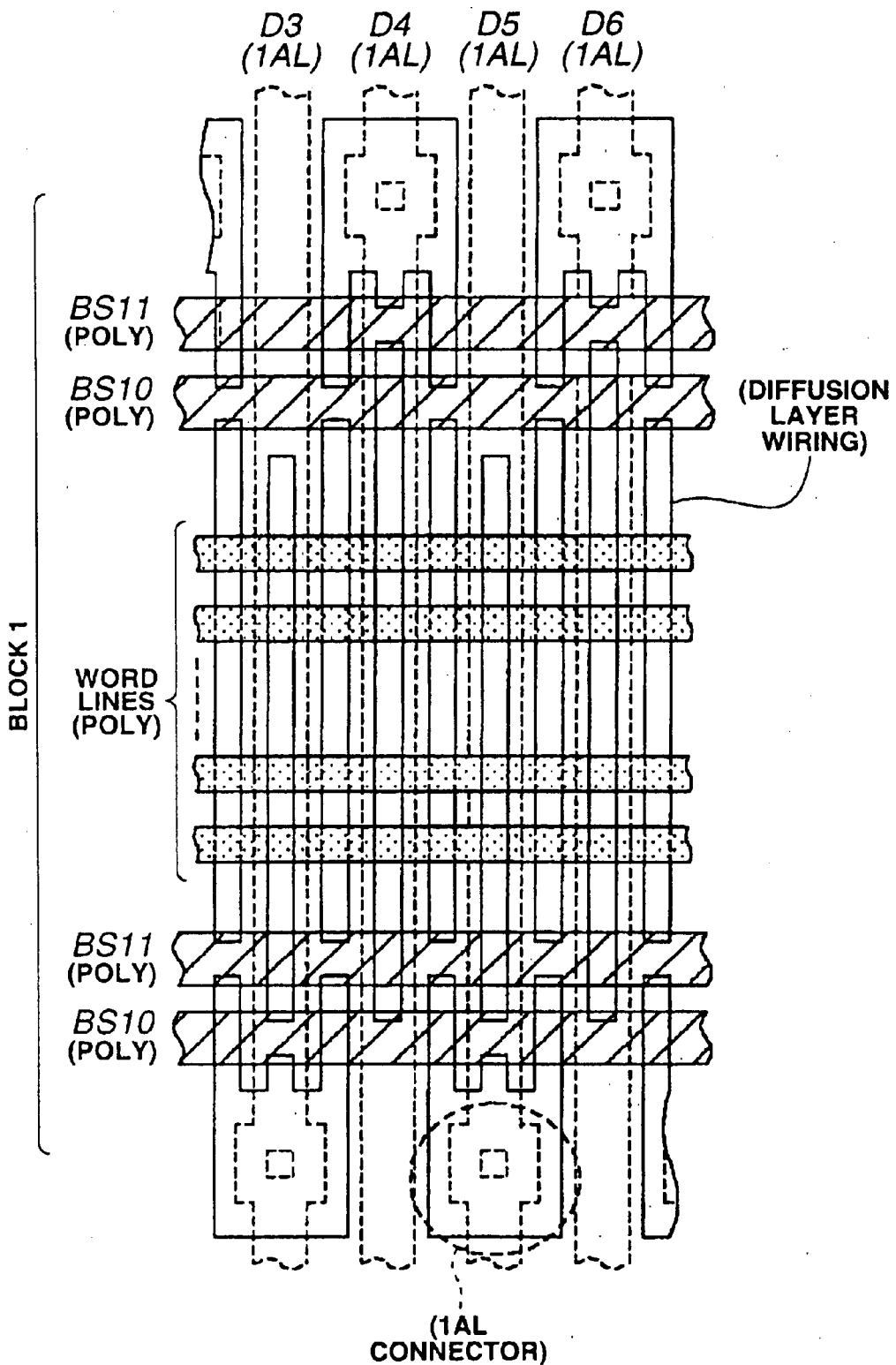

SEMICONDUCTOR MEMORY WITH INTER-BLOCK BIT WIRES AND INTER-BLOCK GROUND WIRES

BACKGROUND OF THE INVENTION

1. Field of the Invention

The present invention relates to semiconductor memories, and more particularly to semiconductor memories including memory cells, each using adjacent two diffusion wires as drain and source, respectively, and a word line as gate.

2. Description of Related Art

The semiconductor memories of the above kind have been widely used as large-capacity memories. The semiconductor memories have accomplished high-speed operation due to a memory cell array made of blocks separated every M word lines in column direction. The blocks share N+1 virtual ground wires, and N main bit lines, each between the adjacent two of the virtual ground wires. Diffusion wires are provided. The diffusion wires are distant one fourth (¼) as much as the virtual ground wires are. The adjacent two blocks in column direction are symmetric with respect to an imaginary line separating them. Memory cells in each column share the adjacent two diffusion wires as drains and sources, and they use the M word lines as gates, respectively. Thus, the blocks have memory cells in M rows and 4N columns. Referring to the accompanying drawings, FIG. 8 is a fragmentary circuit diagram showing a portion of a memory cell array of the semiconductor memory of this kind. U.S. Pat. No. 5,392,233, Iwase, Feb. 21, 1995 (=JP-A 5-167042) shows a ROM using a circuit diagram of this kind.

FIG. 8 shows 3 (three) blocks separated every 3 (three) word lines in column direction. The separated blocks, namely, block 0, block 1 and block 2, share 2 (two) virtual ground wires D3 and D5, and 2 (two) main bit lines D4 and D6, each between the adjacent two of the virtual ground wires. The adjacent two blocks in column direction are symmetric with respect to an imaginary line separating them. Ground-connection to the virtual ground wires is selectively made in response to address operation. The main bit lines are selectively addressed and sensed. In FIG. 8, for illustrative purpose only, the blocks are three in number, the word lines in each block are three in number, the virtual ground wires are two in number, and the main bit lines are two in number.

Diffusion wires are provided. The diffusion wires are distant one fourth (¼) as much as the virtual ground wires are. In each block, memory cells in each column share the adjacent two diffusion wires as drains and sources, and they use three word lines as gates, respectively. In each block, between the adjacent two of the dummy wires, for example, D3 and D5, memory cells in 3 (three) rows and in 4 (four) columns are grouped as a memory cell unit, namely, a four-column memory cell unit. Each block includes four column select lines, two on one ends of the diffusion wires, the other two on the other ends. Further, it includes three bit column select transistors and three ground column select transistors per each four-column memory cell unit.

In the block 1, for example, on one end side of diffusion wires BN11 to BN17, three bit column select transistors S41, S40 and S42 are connected to the main bit line D4. The bit column select transistor S41 has diffusion layer connected to the main bit line D4. It uses the middle diffusion wire BN13 for one four-column memory cell unit as drain or source and the column select line BS11 as gate. Each of the bit column select transistors S40 and S42 has diffusion layer connected to the main bit line D4. The bit column select transistor S40 uses the diffusion wire BN12, lying on one side of and next to the middle diffusion wire BN13, as drain or source and the column select line BS10 as gate. The bit column select transistor S42 uses the diffusion wire BN14, lying on the opposite side of and next to the middle diffusion wire BN13, as drain or source and the column select line BS10 as gate.

In the block 1, on the other end side of the diffusion wires BN11 to BN17, another three ground column select transistors S51, S50 and S52 are connected to the virtual ground wire D5. The ground column select transistor S51 has diffusion layer connected to the virtual ground wire D5. It uses the boundary diffusion wire BN15 for one four-column memory cell unit as drain or source and the column select line BS10 as gate. Each of the ground column select transistors S50 and S52 has diffusion layer connected to the virtual ground wire D5. The ground column select transistor S50 uses the diffusion wire BN14, lying on one side of and next to the boundary diffusion wire BN15, as drain or source and the column select line BS11 as gate. The ground column select transistor S52 uses the diffusion wire BN16, lying on the opposite side of and next to the boundary diffusion wire BN15, as drain or source and the column select line BS11 as gate.

Next, it is now explained how this conventional semiconductor memory selects a memory cell. As is readily understood from the preceding description, the memory cell array of each block is identical in structure every four-column memory cell unit. In each block, the memory performs the same or symmetrical select action every four-column memory cell unit. Thus, description on action to select each of four memory cells M1, M2, M3 and M4 appears to be sufficient. In the block 1, the four memory cells M1 to M4, lying between the virtual ground wires D3 and D5, are connected to the word line W11.

During select operation of these memory cells M1 to M4, the word line W11 of the block 1 only has high level so that the memory cells connected to this word line W11 have ON or OFF level selectively depending on the data to be memorized. The other word lines W10, W12, W00 to W02, and W20 to W22 have low levels so that all of the memory cells connected to them have OFF levels.

In the case where the memory cell M1 is selected, in response to address operation, ground-connection to the virtual ground wire D3 and precharge to the virtual ground wire D5 are selectively made, connection of the main bit line D4 to a sense amplifier is selectively made to be sensed, and the column select line BS10 has high level. Then, the ground column select transistors S31 and S51 have ON levels, respectively, and the bit column select transistors S40 and S42 have ON levels, respectively, making ground-connection to and sensing-connection to the diffusion wires BN11 and BN12, respectively, which are on both sides of a memory cell column including the memory cell M1. Under this condition, ON or OFF status of the memory cell M1 connected to the word line W11 determines sense current flowing through the main bit line D4, which is detected by the sense amplifier.

In the case where the memory cell M2 is selected, in response to address operation, ground-connection to the virtual ground wire D3 and precharge to the virtual ground wire D5 are selectively made, connection of the main bit line D4 to the sense amplifier is selectively made to be sensed, and the column select line BS11 has high level. Then, the ground column select transistors S32 and S50 have ON levels, respectively, and the bit column select transistor S41 has ON level, making ground-connection to and sensing-connection to the diffusion wires SN12 and BN13, respectively, which are on both sides of a memory cell column including the memory cell M2. Under this condition, ON or OFF status of the memory cell M2 connected to the word line W11 determines sense current flowing through the main bit line D4, which is detected by the sense amplifier.

In the case where the memory cell M3 is selected, in response to address operation, ground-connection to the virtual ground wire D5 and precharge to the virtual ground wire D3 are selectively made, connection of the main bit line D4 to the sense amplifier is selectively made to be sensed, and the column select line BS11 has high level. Then, the ground column select transistors S50 and S32 have ON levels, respectively, and the bit column select transistor S41 has ON level, making ground-connection to and sensing-connection to the diffusion wires BN14 and BN13, respectively, which are on both sides of a memory cell column including the memory cell M3. Under this condition, ON or OFF status of the memory cell M3 connected to the word line W11 determines sense current flowing through the main bit line D4, which is detected by the sense amplifier.

In the case where the memory cell M4 is selected, in response to address operation, ground-connection to the virtual ground wire D5 and precharge to the virtual ground wire D3 are selectively made, connection of the main bit line D4 to the sense amplifier is selectively made to be sensed, and the column select line BS10 has high level. Then, the ground column select transistors S51 and S31 have ON levels, respectively, and the bit column select transistors S42 and S40 have ON levels, respectively, making ground-connection to and sensing-connection to the diffusion wires BN15 and BN14, respectively, which are on both sides of a memory cell column including the memory cell M4. Under this condition, ON or OFF status of the memory cell M4 connected to the word line W11 determines sense current flowing through the main bit line D4, which is detected by the sense amplifier.

As is readily seen from the preceding description, precharge is always made to one of the virtual ground wires D3 and D5 of the four-column memory cell unit, preventing the four-column memory cell unit and the adjacent cell units from sharing charge via the selected memory cell, ensuring individual unit operations to select its memory cells, M1 to M4, for example.

FIG. 9 is a fragmentary view of the illustrated portion of layout of the previously described conventional semiconductor memory, illustrating a portion of the block 1 shown in FIG. 8. As is readily seen from FIG. 9, the conventional semiconductor memory has accomplished a considerable increase in storage capacity because each block has memory cells using the adjacent one of equidistant diffusion wires as drain or source and one of word lines as gate, and each block has a connector per each four-column memory cell unit for alternative connection to one of main bit lines and the adjacent diffusion wire. Besides, the conventional semiconductor memory has accomplished high speed operation because the amount of load applied to the main bit lines has dropped by employing a memory cell array composed of blocks separated in column direction at every plural number of word lines to reduce memory cells, in number, selectively connected in parallel to the main bit lines.

The conventional semiconductor memory is capable of accomplishing a further high speed operation with high-speed sense amplifiers due to a sufficiently large margin allowed by small variations in shunt resistance of current flow paths from the main bit lines to the adjacent ones of the virtual ground wires with different memory cells to be selected. Specifically, in the conventional semiconductor memory, the current flow path is composed of equal bit column select transistors, equal memory cells, equal ground-column select transistors, and a single diffusion line and the shunt resistance almost remains unaltered irrespective of which different memory cells is selected.

For further understanding of the above-mentioned issue, reference is made to Iwase, U.S. Pat. No. 5,392,233, particularly to description of FIGS. 5 and 6 ranging from column 6 line 59 to column 7 line 56, which United States Patent as been incorporated herein by reference.

With continuing reference to FIG. 8, according to the conventional semiconductor memory, in order to select, for example, the memory cell M1 or M4, the bit column select transistors S40 and S42 have ON levels, respectively, in response to address operation, allowing charge to the diffusion wires BN12 and N14 from the main bit line D4, and allowing charge to the diffusion wire BN13 depending on the status of the memory cell M2 or M3. In order to select, for example, the memory cell M2 or M3, the bit column select transistor S41 has ON level in response to address operation, allowing charge to the diffusion wire BN13 from the main bit line D4, and allowing charge to the diffusion wire BN14 or BN12 depending on the status of the memory cell M3 or M2.

In the conventional semiconductor memory, as the number of diffusion wires to be charged from the main bit line ranges from one to three depending on address selection and status of memory cells, the amount of charge load capacity to be charged from the main bit line D4 varies three times, narrowing margin, causing a considerable delay in sense judgment time required for a sense amplifier to sense, via the main bit line, appearance of current. This poses a problem that further high-speed operation is difficult to accomplish.

FIGS. 10(A), 10(B) and 10(C) are graphical representations illustrating varying of delay in sense judgment time with different levels in charge load capacity. FIG. 10(A) shows variations of ON level voltage and OFF level voltage appearing for ON level and OFF level of a selected memory cell, respectively, when the load capacity for charge is mean and normal. FIG. 10(B) shows variation of ON level voltage and OFF level voltage appearing for ON level and OFF level of a selected memory cell, respectively, when the load capacity for charge is greater than the mean. FIG. 10(C) shows variation of ON level voltage and OFF level voltage for ON level and OFF level of a selected memory cell when the load capacity is less than the mean. With reference to FIG. 10(A), commonly, accounting for the mean load capacity for charge and margin determines a reference level used by the sense amplifier in making judgment. Address select operation and status of a memory cell selected may cause load capacity for charge to become greater than the mean. In this case, as the charge capacity is constant, undercharge takes place, lowering both ON level and OFF level voltages as shown in FIG. 10(B). Under this condition, margin becomes narrow and a considerable delay in judgment time required for sensing OFF level voltage is observed. If load capacity for charge becomes less than the mean, as the charge capacity is constant, overcharge takes place, elevating both ON level and OFF level voltages as shown in FIG. 10(C). Under this condition, margin becomes narrow and a considerable delay in judgment required for sensing ON level voltage is observed.

As described before, the memory cell array of the conventional semiconductor memory is made of blocks separated every plural word lines in column direction. The conventional semiconductor memory needs one region on one ends of the diffusion wires for two column select lines and three bit column select transistors per every four-column memory cell unit and another region on the other ends of the diffusion wires For two column select lines and three ground column select transistors per the four-column memory cell unit. The proportion of an area occupied by these regions to the overall area of a chip grows bigger and bigger as the number of blocks increases. For a further high speed operation, one measure would be increasing the number of blocks to reduce the number of memory cells connected in parallel to each main bit line for a reduction in load applied to the main bit line. This measure, however, poses a problem that the overall area of a chip inevitably increases.

In order to restrain the overall area of the chip from increasing, the incorporated U.S. Pat. No. 5,392,233 proposes arranging on one ends of diffusion wires one column select line and on the other end of the diffusion wires another column select line. According to this proposed layout, the path of current flowing from a main bit line to the associated virtual ground wire involves a U turn at a memory cell selected by a word line. Thus, the path has varying of values in shunt resistance with difference word lines used in selecting memory cells. Sufficient margin cannot be guaranteed, making it difficult to use sense amplifiers designed for high speed operation, failing to accomplish a satisfactory level of high-speed operation.

Accordingly, the present invention aims at accomplishing a further speed-up in operation of semiconductor memories without any substantial increase in the overall area of a chip.

SUMMARY OF THE INVENTION

An object of the present invention is to provide a semiconductor memory that has realized further speed-up in operation without any substantial increase in the overall area of a chip.

According to an exemplary implementation of the present invention, a semiconductor memory comprises:

a memory cell array including a plurality of blocks separated in column direction every M word lines, the separated blocks sharing N+1 virtual ground wires, which are selectively subject to ground-connection in response to address operation and N main bit lines, each of which is placed between the adjacent two of the virtual ground wires and selectively subject to sensing-connection, the separated-blocks being adjacent one after another in column direction with the adjacent two in symmetric relationship around an imaginary line separating the adjacent two blocks, each of the separated blocks including diffusion wires which are equi-distant one fourth the virtual ground wires are, and memory cells in M rows and in 4N columns grouped as a memory cell unit, each of the separate blocks including, on one end side of the diffusion wires, a bit select line and, per each of the memory cell units, three bit column select transistors, which use a middle diffusion wire and the adjacent two diffusion wires of a set of diffusion wires provided for the memory cell unit as drains or sources, and the bit column select line as gates, each of the three bit column select transistors having diffusion layer connected to one of the main bit lines, each of the separated blocks including, on the other end side of the diffusion wires, a ground select line and, per each of the memory cell units, three ground select transistors, which use a boundary diffusion wire of the set of diffusion wires and the adjacent two diffusion wires as drains or sources, and the ground select line as gates, each of the three ground select transistors having diffusion layer connected to one of the virtual ground lines, inter-block bit wires, each connecting the middle diffusion wire for one of the memory cell units of first block of the separated blocks and the middle diffusion wire for one of the memory cell units of the adjacent second block lying on the other end side of the diffusion wires of the first block, the first block and the adjacent second block having halves of the inter-block bit wires, respectively, inter-block ground wires, each connecting the boundary diffusion wire for the one memory cell unit of the first block and the boundary diffusion wire for the one memory cell unit of the adjacent third block lying on the one end side of the diffusion wires of the first block, the first block and the adjacent third block having halves of the inter-block ground wires, respectively.

In one embodiment, each of the inter-block bit wires interconnects the other ends of the middle diffusion wires of the first block and the adjacent second block, and each of the inter-block ground wires interconnects one ends of the boundary diffusion wires of the first block and the adjacent third block.

In another embodiment, each of the inter-block bit wires interconnects one ends of the middle diffusion wires of the first block and the adjacent second block, and each of the inter-block ground wirers interconnects the other ends of the boundary diffusion wires of the first block and the adjacent third block.

In the embodiment, the inter-block bit wires and the inter-block ground wires are formed within a different wiring layer from where the main bit lines and the virtual ground wires are formed, and the inter-block bit wires and the inter-block ground wires are connected via connectors to the diffusion wires.

In the embodiment, the main bit lines are formed within a different wiring layer than a wiring layer where the virtual ground wires are formed.

In the embodiment, there are provided at least one of dummy bit select block and dummy ground select block lying adjacent and next to one of a first stage block and a last stage block of plural blocks, said dummy bit and ground select blocks being free from memory cells.

In the embodiment, the dummy bit select block includes a bit column select transistor having drain or source connected to one of the inter-block bit lines, and gate connected to the bit select line, and the dummy bit select block includes, per each of the memory cell units, a transistor or dummy diffusion layer connected to one of the inter-block bit lines and being electrically equivalent to three diffusion wires.

In the embodiment, the dummy ground select block includes a ground select transistor having drain or source connected to one of the inter-block ground wire, and gate connected to the ground select line, and wherein the dummy ground select block includes, per each of the memory cell units, a transistor or dummy diffusion layer connected to one of the inter-block ground line and electrically equivalent to the diffusion line.

According to another implementation of the present invention, a semiconductor memory comprises:

a memory cell array including blocks separated every M word lines in column direction, the blocks including a plurality of main bit lines, which are subject to precharge and ground-connection, the blocks being arranged one after another in column direction, with the adjacent two thereof in symmetrical relation about a line separating them, the blocks including diffusion wires, which are distant one half the main bit lines are, and a plurality of memory cells grouped into a memory cell unit in M rows and in two columns, the memory cells using the adjacent two diffusion wires as drain or source and the M word lines as gates, the blocks including diffusion layer connected to one of the main bit lines and three column select transistors, which use the diffusion wire corresponding to one of the main bit lines and the adjacent diffusion wires as drain or source and a first and a second column select lines as gate, the blocks include halves of an inter-block bit line, which interconnect the diffusion lines corresponding to one of the main bit line between one block and the adjacent blocks.

In the embodiment, the memory cell is a non-volatile memory cell having a floating gate or an oxide/nitride/oxide (ONO) film as an under layer of a word line.

BRIEF DESCRIPTION OF THE DRAWINGS

FIG. 9 is a fragmentary layout diagram illustrating a portion of the memory cell array of the semiconductor memory shown in FIG. 8.

DETAILED DESCRIPTION OF THE INVENTION

Figure 1:
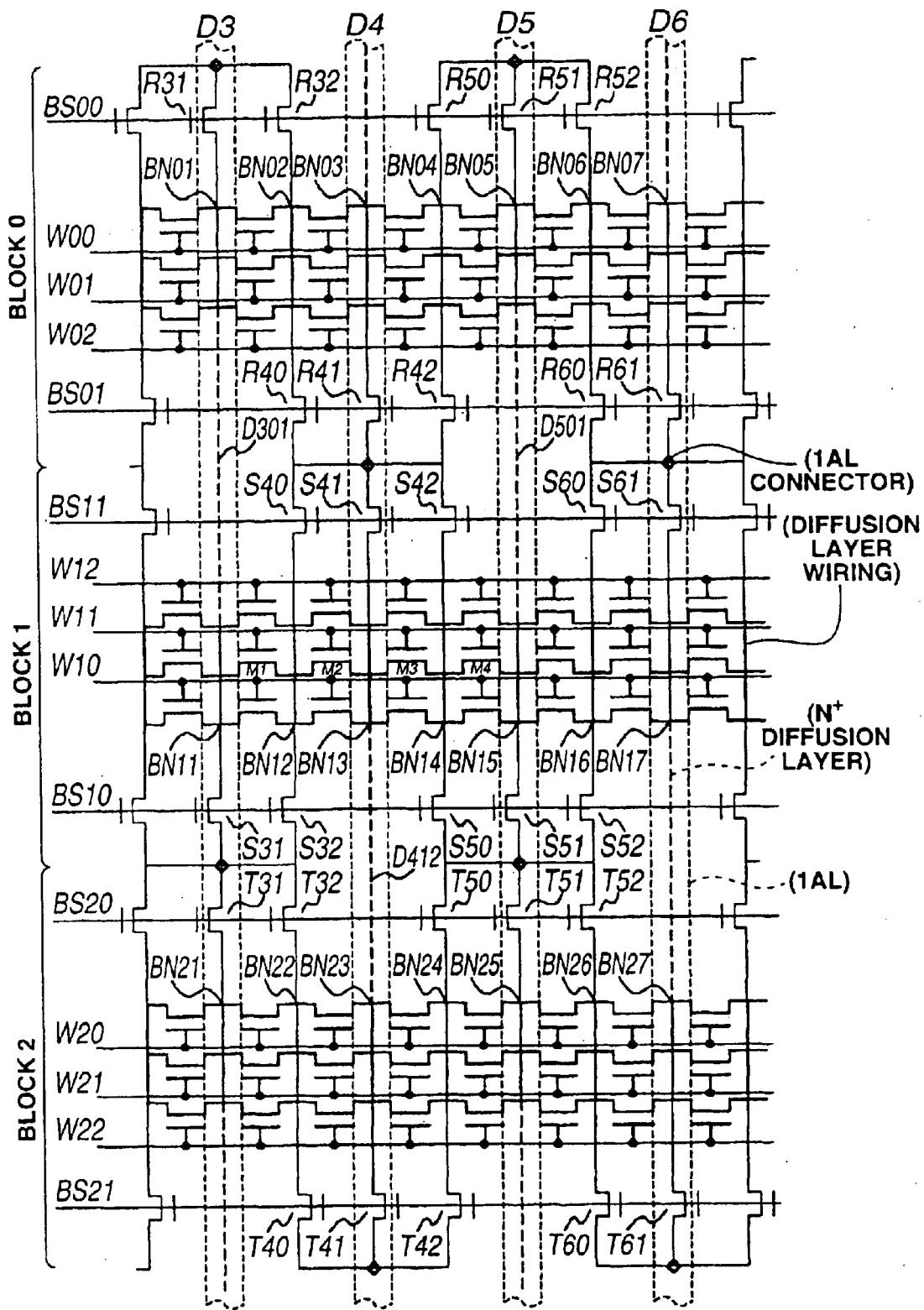
FIG. 1 is a fragmentary circuit diagram of a memory cell array of one embodiment of a semiconductor or memory according to the present invention.
Figure 2:
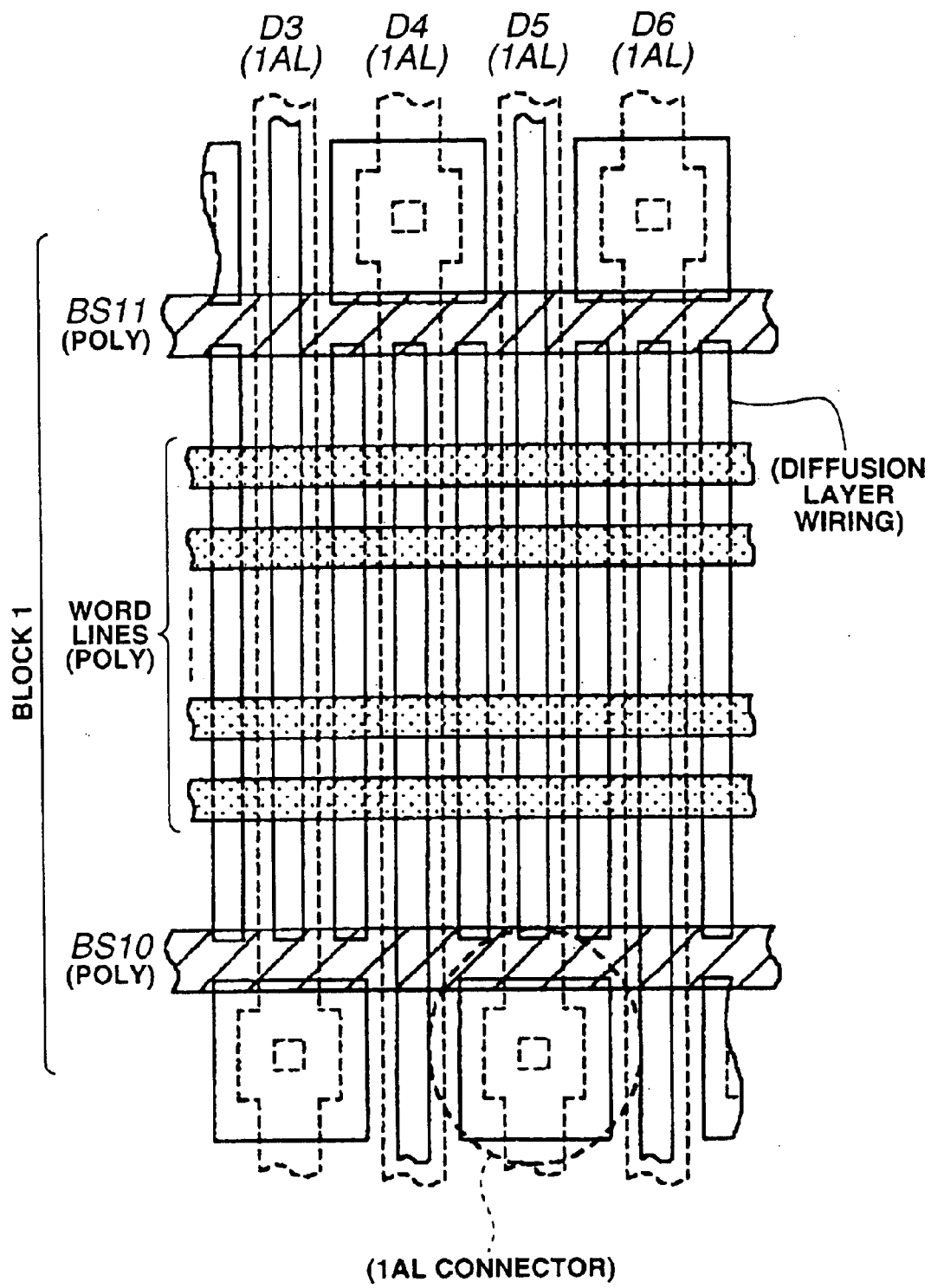
FIG. 2 is a fragmentary layout diagram illustrating a portion of the memory cell array of the semiconductor memory shown in FIG. 1.

Referring to FIGS. 1 to 6 of the accompanying drawings, the present invention is described in detail. FIGS. 1 and 2 show one embodiment of a semiconductor memory according to the present invention.

With reference to FIG. 1, the semiconductor memory according to the present invention includes a memory cell array of a plurality of blocks, only 3 (three) being shown, separated every 3 (three) word lines in column direction. The separated blocks, namely, block 0, block 1 and block 2, share 2 (two) virtual ground wires D3 and D5, and 2 (two) main bit lines D4 and D5, each between the adjacent two of the virtual ground wires. The adjacent two blocks in column direction are symmetric with respect to an imaginary line separating them. Ground-connection to the virtual ground wires is selectively made in response to address operation. The main bit lines are selectively addressed and sensed. In FIG. 1, for illustrative purpose only, the blocks are three in number, the word lines in each block are three in number, the virtual ground wires are two in number, and the main bit lines are two in number.

Diffusion wires are provided. The diffusion wires are equi-distant one fourth (¼) the virtual ground wires are. In each block, memory cells in each column share the adjacent two diffusion wires as drains and sources, and they use three word lines as gates, respectively. In each block, between the adjacent two of the dummy wires, for example, D3 and D5, memory cells in 3 (three) rows and in 4 (four) columns are grouped as a memory cell unit, namely, a four-column memory cell unit. Each block includes, per each four-column memory cell unit, two column select lines, one being a bit column select line on one end side of the diffusion wires, the other being a ground column select line on the other end side. Further, per each four-column memory cell unit, it includes three bit column select transistors for one of the main bit lines and three ground column select transistors for one of the virtual ground lines. It further includes, per each four-column memory cell unit, one half of an inter-block bit wire and one half of an inter-block ground wire.

On one end side of a set of diffusion wires provided per each four-column memory cell unit, the tree bit column select transistors, each, have diffusion layer connected to one of the main bit lines. The bit column select transistors use a middle one and the adjacent two of the set of diffusion wires as drains or sources, and the bit column select line as gates. In the block 1, for example, on one end side of a set of diffusion wires for a four-column memory cell unit including memory cells M1, M2, M3 and M4, three bit column select transistors S41, S40 and S42, each, have diffusion layer connected to the main bit line D4. The bit column select transistors S41, S40 and S42 use a middle one BN13 and the adjacent two BN12 and BN14 of the set of diffusion wires as drains or sources, and the bit column select line BS11 as gates. More specifically, the bit column select transistor S41 uses the middle diffusion wire BN13 as drain or source and the bit column select line BS11 as gate. The bit column select transistor S40 uses the diffusion wire BN12, lying on one side of and next to the middle diffusion wire BN13, as drain or source and the bit column select line BS11 as gate. The bit column select transistor S42 uses the diffusion wire, BN14, lying on the opposite side of and next to the middle diffusion wire BN13, as drain or source and the bit column select line BS11 as gate.

On the other end side of a set of diffusion wires provided per each four-column memory cell unit, the three ground column select transistors, each, have diffusion layer connected to one of the virtual ground wires. The ground column select transistors use an end one and the adjacent two of the set of diffusion wires as drains or sources, and the ground column select line as gates. In the block 1, for example, on the other one end side of a set of diffusion wires for a four-column memory cell unit including memory cells M1, M2, M3 and M4, three ground column select transistors S51, S50 and S52, each, have diffusion layer connected to the ground wire D5. The ground column select transistors S51, S50 and S52 use an end one BN15 and the adjacent two BN14 and BN16 of the set of diffusion wires as drains or sources, and the ground column select line BS10 as gates. More specifically, the ground column select transistor S51 uses the boundary diffusion wire BN15 as drain or source and the ground column select line BS10 as gate. The ground column select transistor S50 uses the diffusion wire BN14, lying on one side of and next to the boundary diffusion wire BN15, as drain or source and the ground column select line BS10 as gate. The ground column select transistor S52 uses the diffusion wire BN16, lying on the opposite side of and next to the boundary diffusion wire BN15, as drain or source and the ground column select line BS10 as gate.

The inter-block bit wire interconnects the other end, not one end, of a middle one of a set of diffusion wires for each of four-column memory cell units of one block and the other end, not one end, of a middle one of a set of diffusion wires for one of four-column memory cell units of the adjacent block lying in the same column and on the other end side of the diffusion wires of the one block. The one and the adjacent blocks contain one half in length of and the other half in length of the inter-block bit wire, respectively. In the embodiment, the inter-block bit wire is formed of diffusion and interconnects the other ends, not one ends, of the middle diffusion wires. For example, an inter-block bit wire D412 for the main bit line D4 between the blocks 1 and 2 interconnects the other end of a middle diffusion wire BN13 of a set of diffusion wires for a four-column memory cell unit of the block 1 and the other end of a middle diffusion wire BN23 of a set of diffusion wires for a four-column memory unit of the block 2 lying on the other end side of the diffusion wires BN11 to BN17 of the block 1.

The inter-block ground wire interconnects one end, not the other end, of the boundary one of a set of diffusion wires for each of four-column memory cell units of one block and one end, not the other end, of the boundary one of a set of diffusion wires for one of four-column memory cell units of the adjacent block lying in the same column and on the one end side of the diffusion wires of the one block. The one and the adjacent blocks contain one half in length of and the other half in length of the inter-block ground wire, respectively. In the embodiment, the inter-block bit wire is formed of diffusion and interconnects the one ends of the boundary diffusion wires. For example, an inter-block ground wire D501 for the virtual ground wire D5 between the blocks 1 and 0 interconnects one end, not the other end, of a boundary diffusion wire BN15 of a set of diffusion wires for a four-column memory cell unit of the block 1 and one end, not the other end, of a boundary diffusion wire BN05 of a set of diffusion wires for a four-column memory unit of the block 0 lying on the one end side of the diffusion wires BN11 to BN17 of the block 1.

Next, it is now explained how the embodiment of semiconductor memory according to the present invention selects a memory cell. As is readily understood from the preceding description, the memory cell array of each block is identical in structure every four-column memory cell unit. In each block, the memory performs the same or symmetrical select action every four-column memory cell unit. Thus, description on action to select each of four memory cells M1, M2, M3 and M4 appears to be sufficient. In the block 1, the four memory cells M1 to M4, lying between the virtual ground wires D3 and D5, are connected to the word line W11.

During select operation of these memory cells M1 to M4, the word line W11 of the block 1 only has high level so that the memory cells connected to this-word line W11 have ON or OFF level selectively depending on the data to be memorized. The other word lines W10, W12, W00 to W02, and W20 to W22 have low levels so that all of the memory cells connected to them have OFF levels.

In the case where the memory cell M1 is selected, in response to address operation, ground-connection to the virtual ground wire D3 and precharge to the virtual ground wire D5 are selectively made, connection of the main bit line D4 to a sense amplifier is selectively made to be sensed, the bit column select line BS11 has high level, and a ground column select line BS00 has high level. Then, the bit column select transistors S40, S41 and S42, and the ground column select transistors R31, R32, R50 and R51 have ON levels, respectively, selectively making ground-connection to the diffusion wire BN11 via the virtual ground wire D3, ground column select transistor R31, diffusion wire BN01 and inter-block ground wire D301. This makes ground-connection to and sensing-connection to the diffusion wires BN11 and BN12, respectively, which are on both sides of a memory cell column including the memory cell M1. Under this condition, ON or OFF status of the memory cell M1 connected to the word line W11 determines sense current flowing through the main bit line D4, which is detected by the sense amplifier.

In the case where the memory cell M2 is selected, in response to address operation, ground-connection to the virtual ground wire D3 and precharge to the virtual ground wire D5 are selectively made, connection of the main bit line D4 to the sense amplifier is selectively made to be sensed, the ground column select line BS10 has high level, and a bit column select line BS21 has high level. Then, the ground column select transistors S31, S32, S50 and S51, and the bit column select transistors T40, T41 and T42 have ON levels, respectively, selectively making sensing-connection to the diffusion wire BN13 via the main bit line D4, bit column select transistor T41, diffusion wire BN23 and inter-block it wire D412. This makes ground-connection to and sensing-connection to the diffusion wires BN12 and BN13, respectively, which are on both sides of a memory cell column including the memory cell M2. Under this condition, ON or OFF status of the memory cell M2 connected to the word line W11 determines sense current flowing through the main bit line D4, which is detected by the sense amplifier.

In the case where the memory cell M3 is selected, in response to address operation, ground connection to the virtual ground wire D5 and precharge to the virtual ground wire D3 are selectively made, connection of the main bit line D4 to the sense amplifier is selectively made to be sensed, the ground column select line BS10 has high level, and a bit column select line BS21 has high level. Then, the ground column select transistors S31, S32, S50 and S51, and the bit column select transistors T40, T41 and T42 have ON levels, respectively, selectively making sensing-connection to the diffusion wire BN13 via the main bit line D4, bit column select transistor T41, diffusion wire BN23 and inter-block bit wire D412. This makes ground-connection to and sensing-connection to the diffusion wires BN14 and BN13, respectively, which are on both sides of a memory cell column including the memory cell M3. Under this condition, ON or OFF status of the memory cell M3 connected to the word line W11 determines sense current flowing through the main bit line D4, which is detected by the sense amplifier.

In the case where the memory cell M4 is selected, in response to address operation, ground-connection to the virtual ground wire D5 and precharge to the virtual ground wire D3 are selectively made, connection of the main bit line D4 to the sense amplifier is selectively made to be sensed, the bit column select line BS11 has high level, and the ground column select line BS00 has high level. Then, the bit column select transistors S40, S41 and S42, and the ground column select transistors R31, R32, R50 and R51 have ON levels, respectively, selectively making ground-connection to the diffusion wire BN15 via the virtual ground wire D5, ground column select transistor R51, diffusion wire BN05 and inter-block ground wire D501. This makes ground-connection to and sensing-connection to the diffusion wires BN15 and BN14, respectively, which are on both sides of a memory cell column including the memory cell M4. Under this condition, ON or OFF status of the memory cell M4 connected to the word-line W11 determines sense current flowing through the main bit line D4, which is detected by the sense amplifier.

As is readily seen from the preceding description, precharge is always made to one of the virtual ground wires D3 and D5 of the four-column memory cell unit, preventing the four-column memory cell unit and the adjacent cell units from sharing charge via the selected memory cell, ensuring individual unit operations to select its memory cells, M1 to M4, for example.

From the preceding description, it is now understood that the embodiment of the present invention charges the four diffusion wires BN12, BN13, BN14 and BN23 from the main bit line D4 in the case where the memory cell M1 or M4 is selected, and charges the four diffusion wires BN22, BN23, BN24 and BN13 from the main bit line D4 in the case where the memory cell M2 or M3 is selected. In this manner, the number of diffusion wires charged from the main bit line D4 is always four, thus keeping the load capacity to be charged from the main bit line D4 constant. Keeping the load capacity constant makes it easy to maintain a stable margin, allowing the use sense amplifiers designed for high-speed operation, contributing much to speed-up in operation of semiconductor memories.

The fragmentary layout diagram in FIG. 2 illustrates a portion of a memory cell array employed by the embodiment of semiconductor memory according to the present invention, and, more particularly, a portion of the block 1 within a portion of the memory cell array shown in FIG. 1. As shown in FIG. 2, the semiconductor memory has, per each four-column memory cell unit, one connector connected to a main bit line within a region on one end side of the diffusion wires and another connector connected to a virtual ground wire within a region on the other one end side of the diffusion wires. Further, the semiconductor memory has one bit select line within the region on the one end side of the diffusion wires and another ground select line within the region on the other end side of the diffusion wires. The proportion of the area of these two regions to the overall area of a chip is small as compared to the conventional semiconductor memory discussed before. Thus, a semiconductor memory with increased storage capacity is possible to fabricate. With the same overall chip area, an increased number of blocks can be placed as compared to the conventional semiconductor memory, causing a reduction in number of memory cells selectively connected in parallel to a main bit line, leading to a drop in load imposed to the main bit line to accomplish increased high-speed operation.

The preceding description on the semiconductor memory was based on the layout that the main bit lines and the virtual ground wires are formed within the same wiring layer 1AL. The present invention is not limited to this layout. As a modification to this layout, the main bit lines and the virtual ground wires may be formed within different wiring layers.

Figure 3:
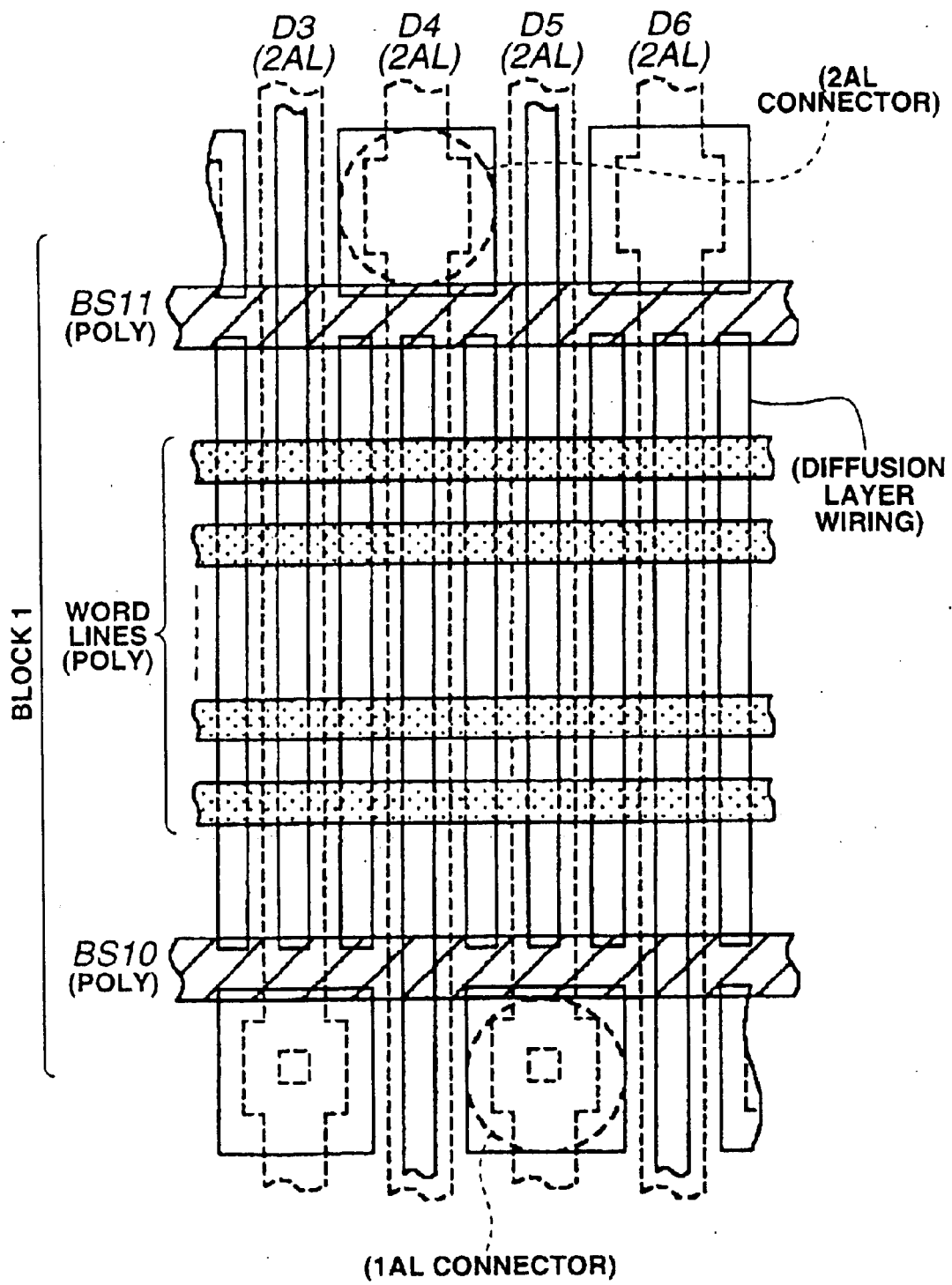
FIG. 3 is a fragmentary layout diagram illustrating a portion of a modification to the semiconductor memory shown in FIG. 1.

This section provides further description on the modification mentioned above. The fragmentary layout diagram in FIG. 3 illustrates a portion of a memory cell array employed by this modification of semiconductor memory, and, more particularly, a portion of the block 1 within a portion of the memory cell array shown in FIG. 1. According to this modification, virtual ground wires D3 and D5 are formed within a wiring layer 1AL, while main bit lines D4 and D6 are formed within a different wiring layer 2AL. Comparing FIG. 3 to FIG. 2 reveals that both are the same in layout. A difference is in that in FIG. 3, the main bit lines D4 and D6 stay in the upper wiring layer 2AL than the lower wiring layer 1AL where the virtual ground wires stay. As compared to the case where the main bit lines D4 and D6 and the virtual ground wires D3 and D5 are formed in the same wiring layer, the restriction on the size of memory cell imposed by wiring pitch is alleviated, making further reduction in memory cell size possible, leading to a reduction in chip size. As the main bit lines are formed within the upper wiring layer, the line capacity decreases, causing a reduction in wiring capacity of the main bit lines. The reduction in wiring capacity is advantageous to high speed operation.

Figure 4:
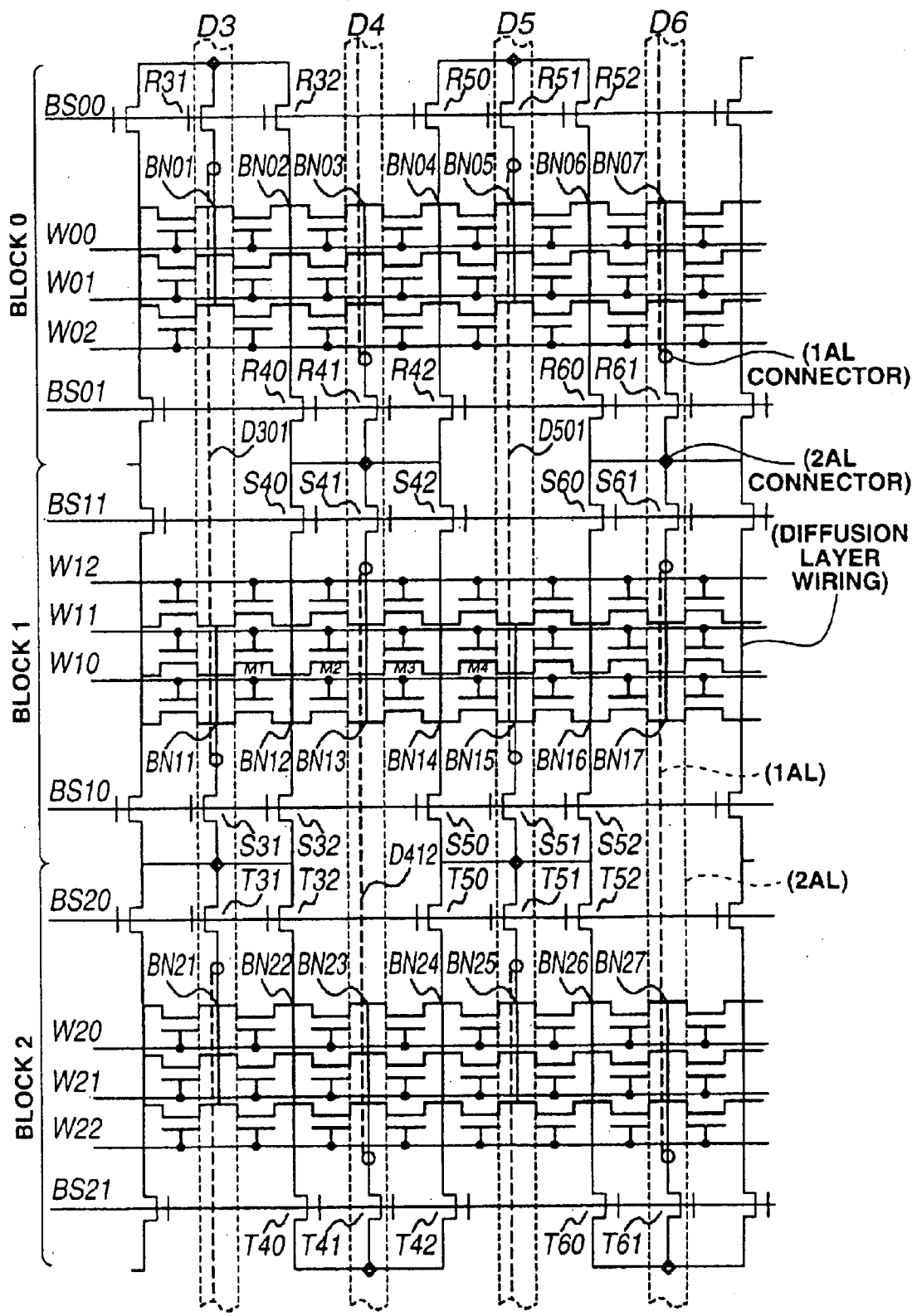
FIG. 4 is a fragmentary circuit diagram of a memory cell array of another embodiment of a semiconductor memory according to the present invention.

The fragmentary circuit diagram in FIG. 4 illustrates a portion of a memory cell array of another embodiment of semiconductor memory according to the present invention.

This embodiment is substantially the same as the first-mentioned embodiment shown in FIG. 1. However, they differ in the manner of connecting an inter-block bit wire and an inter-block ground wire to diffusion wires.

In this embodiment it, the inter-block bit wire interconnects one end, not the other end, of a middle one of a set of diffusion wires for each of four-column memory cell units of one block and one end, not the other one end, of a middle one of a set of diffusion wires for one of four-column memory cell units of the adjacent block lying in the same column and on the other end side of the diffusion wires of the one block. The one and the adjacent blocks contain one half in length of and the other half in length of the inter-block bit wire, respectively. With reference to FIG. 4, for example, an inter-block bit wire D412 for the main bit line D4 between the blocks 1 and 2 interconnects one end of a middle diffusion wire BN13 of a set of diffusion wires for a four-column memory cell unit of the block 1 and one end of a middle diffusion wire BN23 of a set of diffusion wires for, a four-column memory unit of the block 2 lying on the other end side of the diffusion wires BN11 to BN17 of the block 1.

In this embodiment, the inter-block ground wire interconnects the other end, not one end, of the boundary one of a set of diffusion wires for each of four-column memory cell units of one block and the other end, not one end, of the boundary one of a set of diffusion wires for one of four-column memory cell units of the adjacent block lying in the same column and on the one end side of the diffusion wires of the one block. The one and the adjacent blocks contain one half in length of and the other half in length of the inter-block ground wire, respectively. With continuing reference to FIG. 4, for example, an inter-block ground wire D501 for the virtual ground wire D5 between the blocks 1 and 0 interconnects the other end, not one end, of a boundary diffusion wire BN15 of a set of diffusion wires for a four-column memory cell unit of the block 1 and the other end, not one end, of a boundary diffusion wire BN05 of a set of diffusion wires for a four-column memory unit of the block 0 lying on the one end side of the diffusion wires BN11 to BN17 of the block 1. In this embodiment, the inter-block bit wires and inter-block ground wires are not formed within the diffusion layer, but formed within a different wiring layer from a wiring layer where main bit lines and virtual ground wires are formed and connected to the appropriate ends of the diffusion wires via connectors.

Next, it is now explained how this embodiment of semiconductor memory according to the present invention selects a memory cell. This embodiment shown in FIG. 4 is substantially the same as the previously described embodiment shown in FIG. 1 except the orientation of sense current flowing through the diffusion wires. Thus, description on the path of sense current during action to select memory cells in one column including a memory cell M1 chosen out of a four-column memory cell unit including memory cells M1, M2, M3 and M4 appears to be sufficient.

In the case where the memory cell M1 is selected, similarly to the embodiment shown in FIG. 1, ground-connection and sensing-connection are made to the diffusion wires BN11 and BN12, respectively, which are on both sides of the memory cell column including the memory cell M1. Under this condition, ON or OFF status of the memory cell M1 connected to the word line W11 determines sense current flowing through the main bit line D4, which is detected by a sense amplifier. As the inter-block ground wire D301 interconnects the other end of the boundary diffusion wire BN11 and the other end of the boundary diffusion wire BN01, the sense current flows from the one end of the diffusion wire BN12 past the memory cell M1 toward the other end of the boundary diffusion wire BN11.

In the case where any memory cell other than the memory cell M1 in the same column is selected, the sense current flows from the one end of the diffusion wire BN12 past the selected memory cell toward the other end of the boundary diffusion wire BN11. The path from the one end of the diffusion wire BN12 to the other end of the boundary diffusion wire BN11 varies with difference in selection of the memory cells in the same column. However, the shunt resistance of the path of sense current remains the same whichever one of the memory cells in the same column is selected. This is because the path is composed of one diffusion wire and a memory cell. This is applicable to any other columns of memory cells including columns including other memory cells M2, M3 and M4. The shunt resistance of the flow path of sense current from the main bit line D4 to the virtual ground wire D3 is unaltered whichever one of word lines is selected and constant.

In addition to the advantageous features and effectiveness provided by the embodiment shown in FIG. 1, this embodiment of semiconductor memory shown in FIG. 4 can keep the shunt resistance of the flow path of sense current constant against selection of address, making it possible to use sense amplifiers designed for more increased high speed operation.

Figure 5:
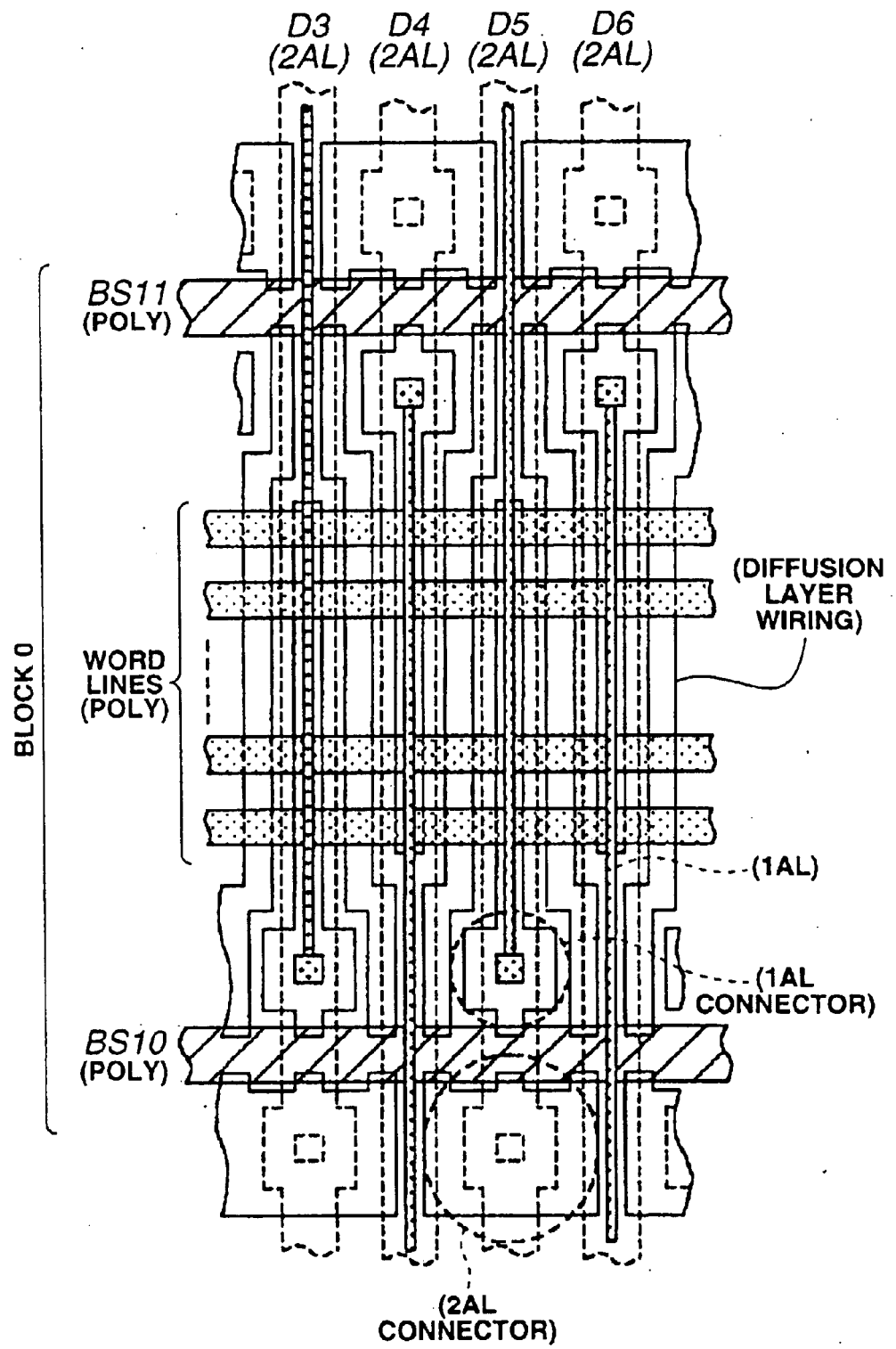
FIG. 5 is a fragmentary layout diagram illustrating a portion of the memory cell array of the semiconductor memory shown in FIG. 4.

The fragmentary layout diagram in FIG. 5 illustrates a portion of a memory cell array employed by this embodiment of semiconductor memory, and, more particularly, a portion of the block 1 within a portion of the memory cell array shown in FIG. 4.

According to this embodiment, as shown in FIG. 5, the semiconductor memory has, per each four-column memory cell unit, one connector connected to a main bit line, which is formed within a wiring layer 1AL, within a region on one end side of the diffusion wires and another connector connected to a virtual ground wire, which is also formed within the wiring layer 1AL, within a region on the other one end side of the diffusion wires. Further, the semiconductor memory has inter-block bit and ground wires, which are formed within the under wiring layer 2AL. Furthermore, the semiconductor memory has one bit select line within the region on the one end side of the diffusion wires and another ground select line within the region on the other end side of the diffusion wires. The proportion of the area of these two regions to the overall area of a chip is small as compared to the conventional semiconductor memory discussed before. Thus, a semiconductor memory with increased storage capacity is possible to fabricate. With the same overall chip area, an increased number of blocks can be placed as compared to the conventional semiconductor memory, causing a reduction in number of memory cells selectively connected in parallel to a main bit line, leading to a drop in load imposed to the main bit line to accomplish increased high-speed operation.

As readily seen from the preceding description, according to the embodiments shown in FIGS. 1 and 4, the semiconductor memory selects one word line and then selects one of the memory cells connected to the selected word line by high level combination of bit column select and ground column select lines of the block which the selected word line belongs to and the adjacent two blocks in the column direction. This action to select a memory cell can be guaranteed even if a selected word line belong to a block that is the first stage or last stage block of the plural blocks by providing as adjacent blocks dummy blocks in the column direction.

Figure 6:
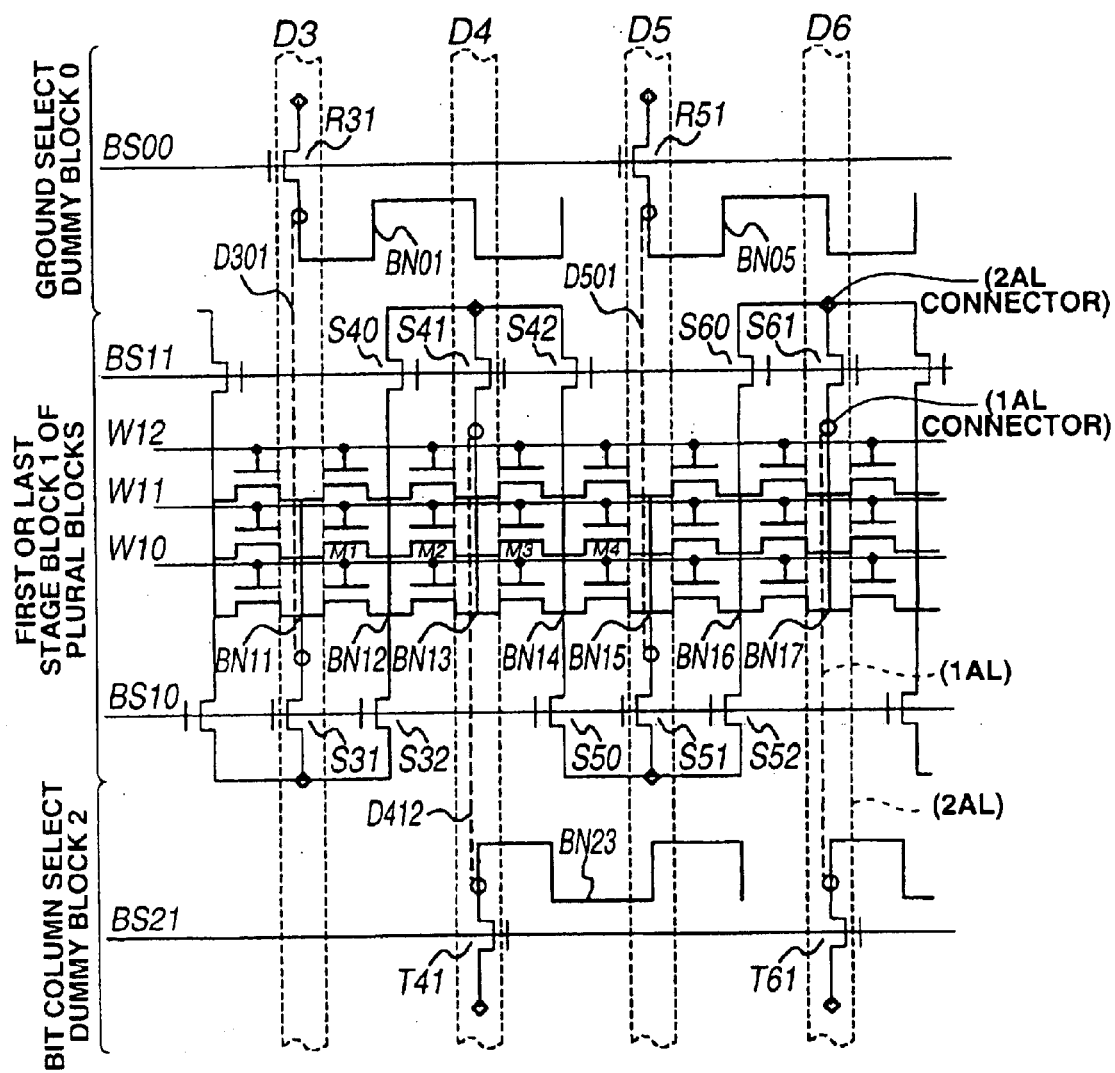
FIG. 6 is a fragmentary circuit diagram illustrating a portion of dummy blocks adjacent to the first or last stage block of a plurality of blocks of the semiconductor memory shown in FIG. 4.
Figure 7:
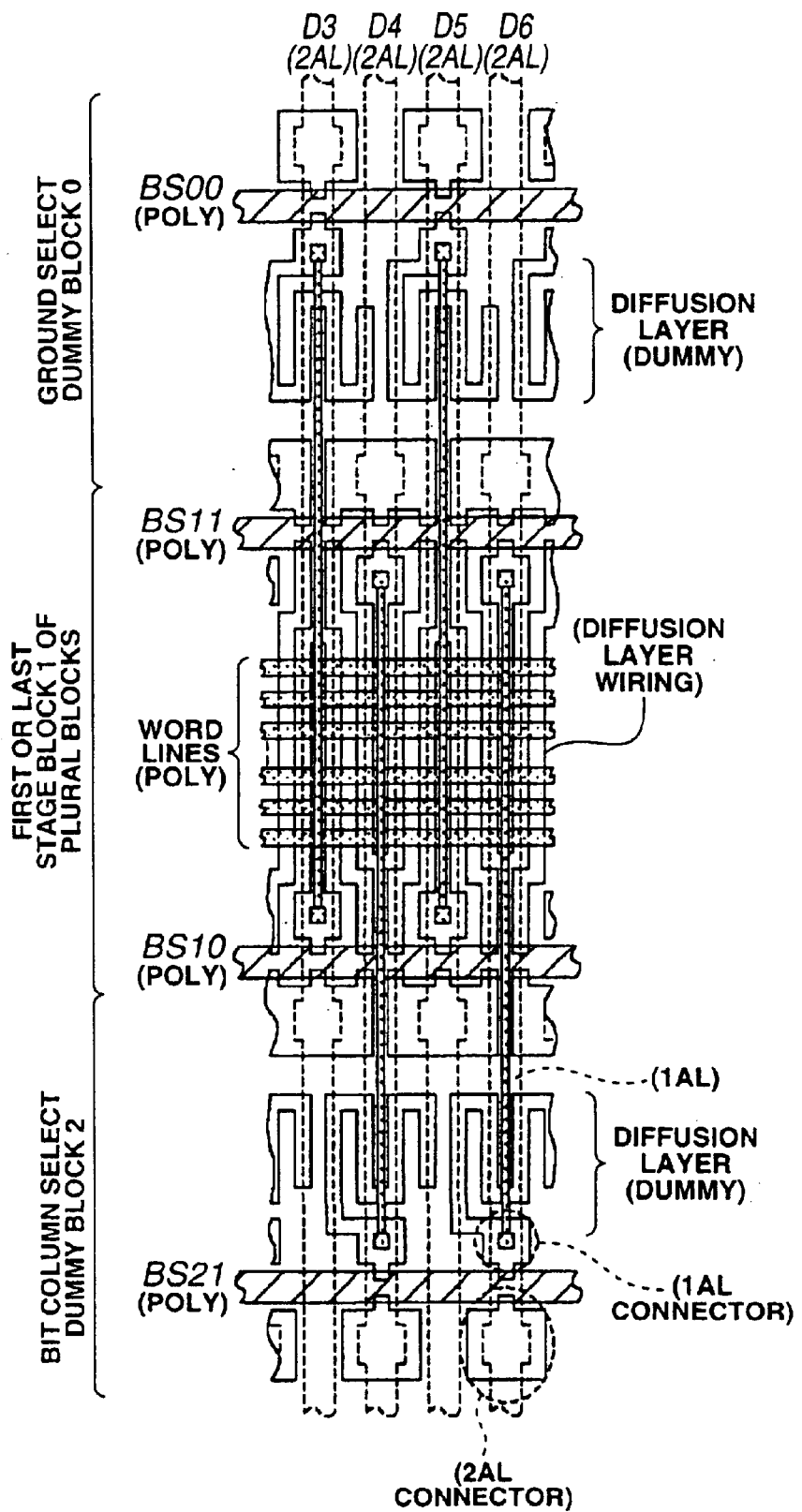
FIG. 7 is a fragmentary layout diagram illustrating a portion of the dummy blocks of the semiconductor memory shown in FIG. 6.
Figure 8:
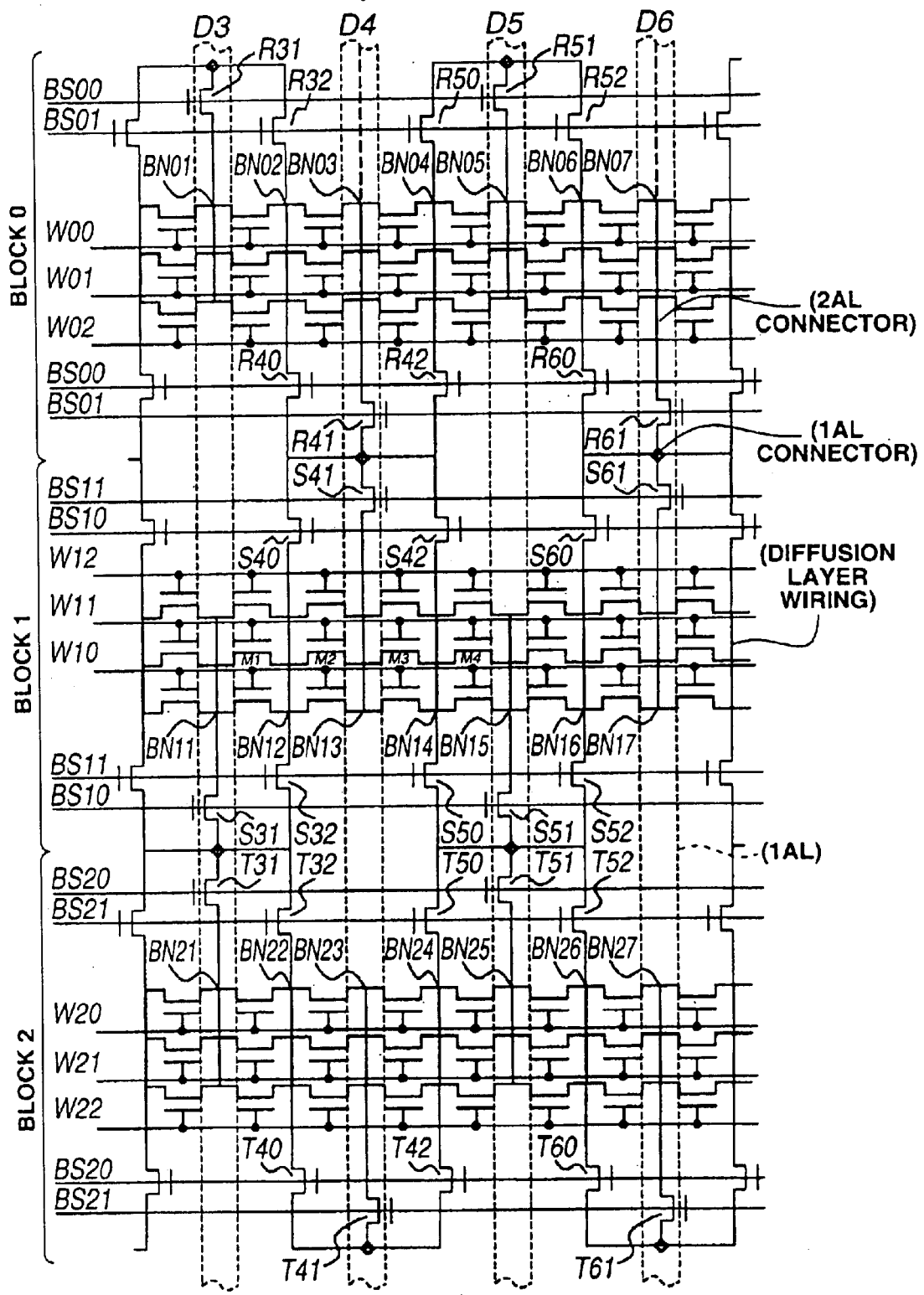
FIG. 8 is a fragmentary circuit diagram illustrating a portion of a memory cell array of the conventional semiconductor memory discussed before.
Figure 10A:
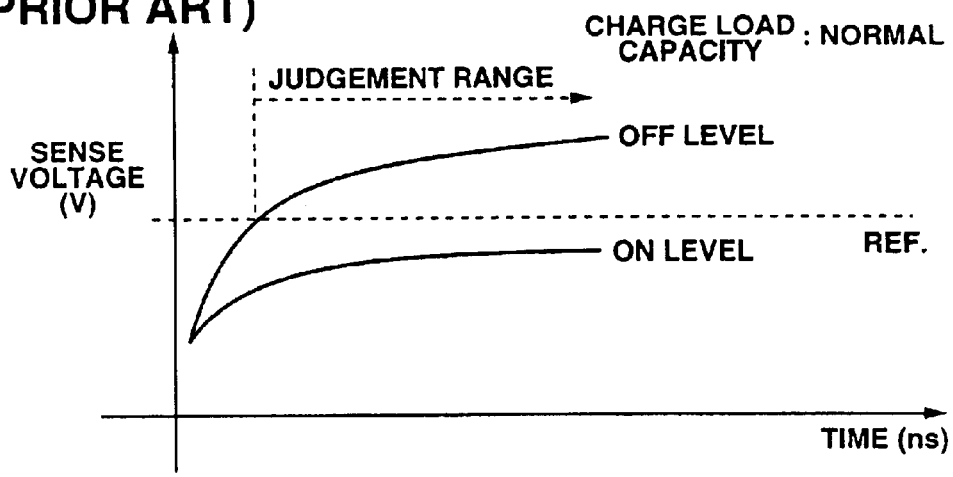
FIGS. 10(A), 10(B) and 10(C) are graphical representations illustrating delays in sensing time required for judgment under three different levels of load capacity for charge.
Figure 10B:
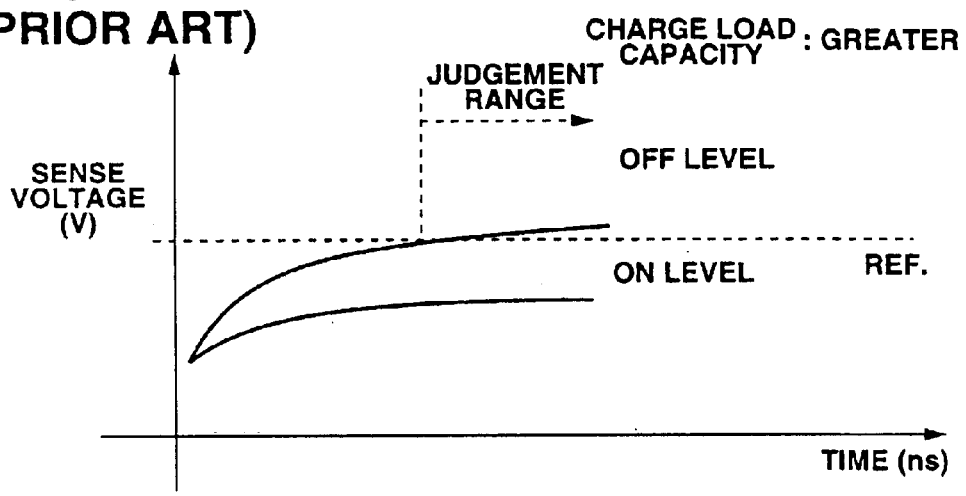
Figure 10C:
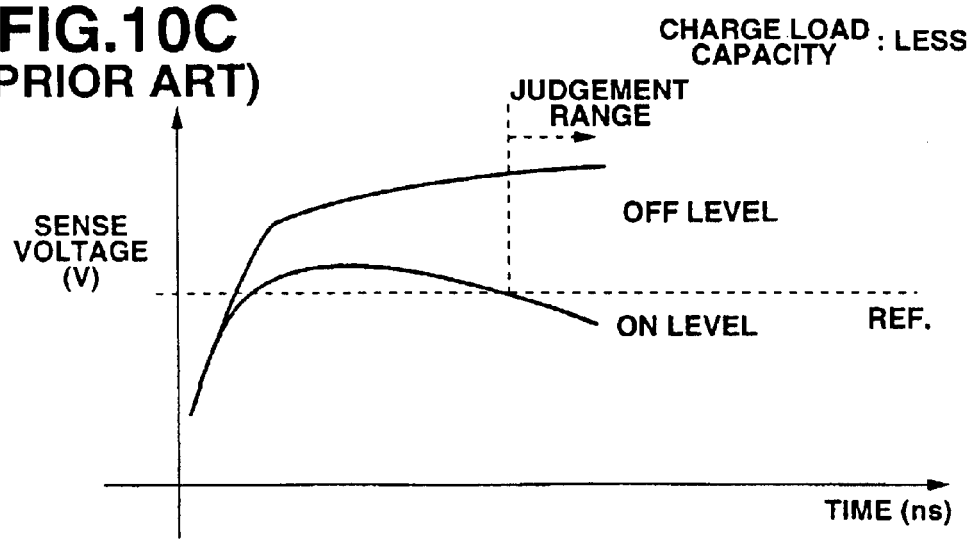

FIG. 6 is a fragmentary circuit diagram illustrating a portion of an example of dummy blocks lying adjacent the first or last stage block of the plural-blocks in the semiconductor memory according to the embodiment shown in FIG. 4. FIG. 7 is a fragmentary layout illustrating the dummy blocks shown in FIG. 6. In FIGS. 6 and 7, the block 1 is illustrated as representing the plural blocks and used in explaining the first stage or last stage block, for illustrative purpose only.

With reference to FIG. 6, the semiconductor memory has a dummy ground column select block 0 lying adjacent or next to the first stage block and a dummy bit column select block 2 lying adjacent or next to the last stage block. Both of the dummy blocks 0 and 2 do not have memory cells.

The dummy ground column select block 0 has, per each four-column memory cell unit, a ground column select transistor, which has drain or source connected to inter-block ground and virtual ground wires and gate connected to a ground column select line, and a transistor or a dummy diffusion layer, which is electrically equivalent to a diffusion wire, connected to the inter-block ground wire. With reference to FIG. 6, a ground column select transistor R51, for example, has drain or source connected to an inter-block ground wire D501 and virtual ground wire D5 and gate connected to a ground select line BS00 A diffusion layer BN05 connected to the inter-block ground wire D501 is electrically equivalent to a diffusion wire BN15 of the block 1.

The dummy bit column select block 2 has, per each four-column memory cell unit, a bit column select transistor, which has drain or source connected to an inter-block bit wire and a main bit line and gate connected to a bit column select line, and a transistor or a dummy diffusion layer, which is electrically equivalent to three diffusion wires, connected to the inter-block bit wire. With reference to FIG. 6, a bit column select transistor T41, for example, has drain or source connected to an inter-block bit wire D412 and main bit line D4 and gate connected to a bit select line BS21. A diffusion layer BN23 connected to the inter-block bit wire D412 is electrically equivalent to three diffusion wires BN12, BN13 and BN14 of the block 1.

Next, it is now explained how the first stage or last stage block cooperates with the dummy ground select block 0 or the dummy bit column select block 2 in selecting a memory cell. As the dummy ground column select block 0 and bit column select block 2 is identical and operates in the same manner every four-column memory cell unit, description on action to select each of four memory cells M1, M2, M3 and M4 appears to be sufficient. In the first or last stage block 1, the four memory cells M1 to M4, lying between the virtual ground wires D3 and D5, are connected to the word line W11.

In the case where the memory cell M1 is selected, in response to address operation, ground-connection to the virtual ground wire D3 and precharge to the virtual ground wire D5 are selectively made, connection of the main bit line D4 to a sense amplifier is selectively made to be sensed, the bit column select line BS11 has high level, and a dummy ground column select line BS00 has high level. Then, the bit column select transistors S40, S41 and S42, and the ground column select transistors R31 and R51 have ON levels, respectively, selectively making ground-connection to the diffusion wire BN11 via the virtual ground wire D3, ground column select transistor R31, and inter-block ground wire D301. This makes ground-connection to and sensing-connection to the diffusion wires BN11 and BN12, respectively, which are on both sides of a memory cell column, including the memory cell M1. Under this condition, ON or OFF status of the memory cell M1 connected to the word line W11 determines sense current flowing through the main bit line D4, which is detected by the sense amplifier.

In the case where the memory cell M2 is selected, in response to address operation, ground-connection to the virtual ground wire D3 and precharge to the virtual ground wire D5 are selectively made, connection of the main bit line D4 to the sense amplifier is selectively made to be sensed, the ground column select line BS10 has high level, and a bit column select line BS21 has high level. Then, the ground column select transistors S31, S32, S50 and S51, and the bit column select transistor T41 have ON levels, respectively, selectively making sensing-connection to the diffusion wire BN13 via the main bit line D4, bit column select transistor T41, and inter-block bit wire D412. This makes ground-connection to and sensing-connection to the diffusion wires BN12 and BN13, respectively, which are on both sides of a memory cell column including the memory cell M2. Under this condition, ON or OFF status of the memory cell M2 connected to the word line W11 determines sense current flowing through the main bit line D4, which is detected by the sense amplifier.

In the case where the memory cell M3 is selected, in response to address operation, ground-connection to the virtual ground wire D5 and precharge to the virtual ground wire D3 are selectively made, connection of the main bit line D4 to the sense amplifier is selectively made to be sensed, the ground column select line BS10 has high level, and a bit column select line BS21 has-high level. Then the ground column select transistors S31, S32, S50 and S51, and the bit column select transistor T41 have ON levels, respectively, selectively making sensing-connection to the diffusion wire BN13 via the main bit line D4, bit column select transistor T41, and inter-block bit wire D412. This makes ground-connection to and-sensing-connection to the diffusion wires BN14 and BN13, respectively, which are on both sides of a memory cell column including the memory cell M3. Under this condition, ON or OFF status of the memory cell M3 connected to the word line W11 determines sense current flowing through the main bit line D4, which is detected by the sense amplifier.

In the case where the memory cell M4 is selected, in response to address operation, ground-connection to the virtual ground wire D5 and precharge to the virtual ground wire D3 are selectively made, connection of the main bit line D4 to the sense amplifier is selectively made to be sensed, the bit column select line BS11 has high level, and the ground column select line BS00 has high level. Then, the bit column select transistors S40, S41 and S42, and the ground column select transistors R31 and R51 have ON levels, respectively, selectively making ground-connection to the diffusion wire BN15 via the virtual ground wire D5, ground column select transistor R51, and inter-block ground wire D501. This makes ground-connection to and sensing-connection to the diffusion wires BN15 and BN14, respectively, which are on both sides of a memory cell column including the memory cell M4. Under this condition, ON or OFF status of the memory cell M4 connected to the word line W11 determines sense current flowing through the main bit line D4, which is detected by the sense amplifier.

The first stage or last stage block can operate in the same manner an inner block of the plural blocks by providing the dummy ground column select block 0 or bit column select block 2 adjacent or next to the first stage or last stage block. As memory cells are not required in the dummy ground column select block 0 or bit column select block 2, increasing in area of regions for circuits can be restrained.

The preceding description on the embodiments shown in FIGS. 1 and 4 has indicated that each block shared virtual ground wires and main bit lines. The present invention is not limited to this. A possible modification does not need to separate the function as a main bit line from the function as a ground wire.

According to a modification, a semiconductor memory comprises:

a memory cell array including blocks separated every M word lines in column direction, the blocks including a plurality of main bit lines, which are subject to precharge and ground-connection, the blocks being arranged one after another in column direction, with the adjacent two thereof in symmetrical relation about a line separating them, the blocks including diffusion wires, which are distant one half the main bit lines are, and a plurality of memory cells grouped into a memory cell unit in M rows and in two columns, the memory cells using the adjacent two diffusion wires as drain or source and the M word lines as gates, the blocks including diffusion layer connected to one of the main bit lines and three column select transistors, which use the diffusion wire corresponding to one of the main bit lines and the adjacent diffusion wires as drain or source and a first and a second column select lines as gate, the blocks include halves of an inter-block bit line, which interconnect the diffusion lines corresponding to one of the main bit line between one block and the adjacent blocks.

The previous description on the embodiments indicated that a memory cell might have a read-only function. The memory cell may be a non-volatile memory cell having a floating gate or an oxide/nitride/oxide (ONO) film as an under layer of a word line.

Although the present invention and its advantage have been described in detail, it should be understood that various changes, substitutions and alternations could be made herein without departing from the sprit and scope of the invention.

The present application claims the priority of Japanese Patent Application No. 2002-327239, filed Nov. 11, 2002, the disclosure of which is hereby incorporated by reference in its entirety.

What is claimed is:

1. A semiconductor memory, comprising:

a memory cell array including a plurality of blocks separated in column direction every M word lines, the separated blocks-sharing N+1 virtual ground wires, which are selectively subject to ground-connection in response to address operation and N main bit lines, each of which is placed between the adjacent two of the virtual ground wires and selectively subject to sensing-connection, the separated blocks being adjacent one after another in column direction with the adjacent two in symmetric relationship around an imaginary line separating the as adjacent two blocks, each of the separated blocks including diffusion wires which are equi-distant one fourth the virtual ground wires are, and memory cells in M rows and in 4N columns grouped as a memory cell unit, each of the separated blocks including, on one end side of the diffusion wires, a bit column select line and, per each of the memory cell units, three bit column select transistors, which use a middle diffusion wire and the adjacent two diffusion wires of a set of diffusion wires provided for the memory cell unit as drains or sources, and the bit column select line as gates, each of the three bit column select transistors having diffusion layer connected to one of the main bit lines, each of the separated blocks including, on the other end side of the diffusion wires, a ground column select line and, per each of the memory cell units, three ground column select transistors, which use a boundary diffusion wire of the set of diffusion wires and the adjacent two diffusion wires as drains or sources, and the ground column select line as gates, each of the three ground column select transistors having diffusion layer connected to one of the virtual ground wires, inter-block bit wires, each connecting the middle diffusion wire for one of the memory cell units of a first block of the separated blocks and the middle diffusion wire for one of the memory cell units of an adjacent second block lying on the other end side of the diffusion wires of the first block, the first block and the adjacent second block having halves of the inter-block bit wires, respectively, inter-block ground wires, each connecting the boundary diffusion wire for the one memory cell unit of the first block and the boundary diffusion wire for the one memory cell unit of an adjacent third block lying on the one end side of the diffusion wires of the first block, the first block and the adjacent third block having halves of the inter-block ground wires, respectively.

2. The semiconductor memory as claimed in claim 1, wherein each of the inter-block bit wires interconnects the other ends of the middle diffusion wires of the first block and the adjacent second block, and wherein each of the inter-block ground wires interconnects one ends of the boundary diffusion wires of the first block and the adjacent third block.

3. The semiconductor memory as claimed in claim 1, wherein each of the inter-block bit wires interconnects one ends of the middle diffusion wires of the first block and the adjacent second block, and wherein each of the inter-block ground wirers interconnects the other ends of the boundary diffusion wires of the first block and the adjacent third block.

4. The semiconductor memory as claimed in claim 3, wherein the inter-block bit wires and the inter-block ground wires are formed within a different wiring layer from where the main bit lines and the virtual ground wires are formed, and wherein the inter-block bit wires and the inter-block ground wires are connected via connectors to the diffusion wires.

5. The semiconductor memory as claimed in claim 1, wherein the main bit lines are formed within a different wiring layer than a wiring layer where the virtual ground wires are formed.

6. The semiconductor memory as claimed in claim 1, including at least one of dummy bit select block and dummy ground select block lying adjacent and next to one of a first stage block and a last stage block of plural blocks, said dummy bit and ground select blocks being free from memory cells.

7. The semiconductor memory as claimed in claim 6, wherein the dummy bit select block includes a bit column select transistor having drain or source connected to one of the inter-block bit wires, and gate connected to the bit column select line, and wherein the dummy bit select block includes, per each of the memory cell units, a transistor or dummy diffusion layer connected to one of the inter-block bit wires and being electrically equivalent to three diffusion wires.

8. The semiconductor memory as claimed in claim 6, wherein the dummy ground select block includes a ground column select transistor having drain or source connected to one of the inter-block ground wire, and gate connected to the ground column select line, and wherein the dummy ground select block includes, per each of the memory cell units, a transistor or dummy diffusion layer connected to one of the inter-block ground wires and electrically equivalent to three diffusion wires.

9. A semiconductor memory comprising:

a memory cell array including blocks separated every M word lines in column direction, the blocks including a plurality of main bit lines, which are subject to pre-charge and ground-connection, the blocks being arranged one after another in column direction, with the adjacent two thereof in symmetrical relation about a line separating them, the blocks including diffusion wires, which are distant one half the main bit lines are, and a plurality of memory cells grouped into a memory cell unit in M rows and in two columns, the memory cells using the adjacent two diffusion wires as drain or source and the M word lines as gates, the blocks including diffusion layer connected to one of the main bit lines and three column select transistors, which use the diffusion wire corresponding to one of the main bit lines and the adjacent diffusion wires as drain or source and a first and a second column select lines as gate, the blocks include halves of an inter-block bit wire, which interconnect the diffusion wires corresponding to one of the main bit line between one block and the adjacent blocks.

* * * * *